(12) United States Patent
Cui

(10) Patent No.: US 12,063,820 B2
(45) Date of Patent: Aug. 13, 2024

(54) DISPLAY PANEL AND DISPLAY APPARATUS

(71) Applicant: WUHAN TIANMA MICROELECTRONICS CO., LTD., Wuhan (CN)

(72) Inventor: Ruili Cui, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 393 days.

(21) Appl. No.: 17/704,777

(22) Filed: Mar. 25, 2022

(65) Prior Publication Data
US 2023/0247865 A1 Aug. 3, 2023

(30) Foreign Application Priority Data
Jan. 28, 2022 (CN) .......................... 202210106955.X

(51) Int. Cl.
H01L 35/24 (2006.01)
H01L 51/00 (2006.01)
(Continued)

(52) U.S. Cl.
CPC ......... *H10K 59/122* (2023.02); *H10K 50/865* (2023.02); *H10K 59/30* (2023.02)

(58) Field of Classification Search
CPC .... H10K 59/122; H10K 50/865; H10K 59/30; H10K 2102/3026; H10K 59/80515; H10K 59/126; H10K 59/00
(Continued)

(56) References Cited

U.S. PATENT DOCUMENTS

2004/0217702 A1* 11/2004 Garner ................... H10K 50/85
445/24
2015/0041779 A1* 2/2015 Park ..................... H10K 59/873
362/326

FOREIGN PATENT DOCUMENTS

CN 107808934 A 3/2018
CN 111883565 A 11/2020
(Continued)

OTHER PUBLICATIONS

English Translation of the First Chinese Office Action mailed on Sep. 1, 2023. issued in corresponding Chinese Application No. 202210106955.X, filed on Jan. 28, 2022, 9 pages.

*Primary Examiner* — Theresa T Doan
(74) *Attorney, Agent, or Firm* — CHRISTENSEN O'CONNOR JOHNSON KINDNESS PLLC

(57) ABSTRACT

A display panel and a display apparatus are provided. The display panel includes a light-emitting unit, a pixel defining layer, and a light-shielding layer. The light-emitting unit includes first and second electrodes, and a light-emitting layer. The pixel defining layer includes an opening portion where the light-emitting layer is partially located, and a non-opening portion. The first electrode is located in the opening portion in a direction perpendicular to a plane of the substrate and includes first and second openings. In the direction perpendicular to the plane of the substrate, the light-shielding layer does not overlap with the first opening. Orthographic projections of the light-shielding layer and the first electrode on the plane of the substrate are first and second projections, respectively. In a first direction, a difference between a length of the second opening and a sum of lengths of the first and second projections satisfies a preset threshold.

20 Claims, 6 Drawing Sheets

(51) Int. Cl.
*H10K 50/86* (2023.01)
*H10K 59/122* (2023.01)
*H10K 59/30* (2023.01)

(58) Field of Classification Search
USPC .......................................................... 257/40
See application file for complete search history.

(56) References Cited

FOREIGN PATENT DOCUMENTS

CN 113394300 A 9/2021
KR 20140079684 A 6/2014

\* cited by examiner

DISPLAY PANEL AND DISPLAY APPARATUS

CROSS-REFERENCE TO RELATED APPLICATION

The present application claims the benefit of Chinese Patent Application No. 202210106955.X, filed on Jan. 28, 2022, the content of which is incorporated herein by reference in its entirety.

TECHNICAL FIELD

The present disclosure relates to the technical field of displays, and in particular, to a display panel and a display apparatus.

BACKGROUND

In recent years, with the continuous development of display technologies, consumers have higher requirements on displays. There are various types of displays, including liquid crystal displays (LCD) and self-luminous displays. With these displays, display technologies including touch display technology, curved display technology, under-screen camera technology, and under-screen fingerprint recognition technology have emerged.

A self-luminous display includes light-emitting units formed on a side of a substrate. In a display process of the self-luminous display, light emitted by light-emitting units not only propagates towards a side of the light-emitting unit away from the substrate, but also partially propagates towards other directions, e.g., towards a side of the light-emitting unit facing towards the substrate. If a light-collecting module is mounted on the display to enrich functions of the display, at least part of light propagating in a non-target direction of the display panel will be transmitted to the light-collecting module and affect the normal operation of the light-collecting module.

SUMMARY

In view of this, embodiments of the present disclosure provide a display panel and a display apparatus, to reduce the intensity of light emitted through a side, which is away from light-emitting units, of a substrate of a display panel.

According to one aspect, an embodiment of the present disclosure provides a display panel. The display panel includes a substrate, at least one light-emitting unit, a pixel defining layer, and a light-shielding layer. One of the at least one light-emitting unit includes a first electrode and a second electrode that are opposite to each other, and a functional layer located between the first electrode and the second electrode. The first electrode is located at a side of the functional layer facing towards the substrate, and the functional layer includes a light-emitting layer. The pixel defining layer is located between the first electrode and the functional layer and includes an opening portion and a non-opening portion. At least a part of the light-emitting layer is located in the opening portion. In a direction perpendicular to a plane of the substrate, the first electrode is located in the opening portion. The opening portion includes a first opening close to the substrate and a second opening away from the substrate. The light-shielding layer is located at a side of the non-opening portion facing towards the substrate. In the direction perpendicular to the plane of the substrate, the light-shielding layer at least partially overlaps with the second electrode and does not overlap with the first opening. An orthographic projection of the light-shielding layer on the plane of the substrate is a first projection. An orthographic projection of the first electrode on the plane of the substrate is a second projection. A difference between a length of the second opening in a first direction and a sum of a length of the first projection in the first direction and a length of the second projection in the first direction satisfies a preset threshold. The first direction is parallel to the plane of the substrate, and a straight line connecting any position on an edge of the first opening with a geometrical center of the first opening is parallel to the first direction.

According to another aspect, some embodiments of the present disclosure provide a display apparatus including a display panel. The display panel includes a substrate, at least one light-emitting unit, a pixel defining layer, and a light-shielding layer. One of the at least one light-emitting unit includes a first electrode and a second electrode that are opposite to each other, and a functional layer located between the first electrode and the second electrode. The first electrode is located at a side of the functional layer facing towards the substrate, and the functional layer includes a light-emitting layer. The pixel defining layer is located between the first electrode and the functional layer and includes an opening portion and a non-opening portion. At least a part of the light-emitting layer is located in the opening portion. In a direction perpendicular to a plane of the substrate, the first electrode is located in the opening portion. The opening portion includes a first opening close to the substrate and a second opening away from the substrate. The light-shielding layer is located at a side of the non-opening portion facing towards the substrate. In the direction perpendicular to the plane of the substrate, the light-shielding layer at least partially overlaps with the second electrode and does not overlap with the first opening. An orthographic projection of the light-shielding layer on the plane of the substrate is a first projection. An orthographic projection of the first electrode on the plane of the substrate is a second projection. A difference between a length of the second opening in a first direction and a sum of a length of the first projection in the first direction and a length of the second projection in the first direction satisfies a preset threshold. The first direction is parallel to the plane of the substrate, and a straight line connecting any position on an edge of the first opening with a geometrical center of the first opening is parallel to the first direction.

BRIEF DESCRIPTION OF DRAWINGS

In order to more clearly describe the embodiments of the present disclosure or the technical solution in the related art, the drawings used in the description of the embodiments or the related art will be briefly described below. The drawings in the following description are some embodiments of the present disclosure. Those skilled in the art can obtain other drawings based on these drawings.

DESCRIPTION OF EMBODIMENTS

To better understand the technical solutions of the present disclosure, the embodiments of the present disclosure are described in detail below with reference to the accompanying drawings.

It should be noted that the embodiments in the following descriptions are only a part rather than all of the embodiments in the present disclosure. All other embodiments obtained by a person of ordinary skill in the art on the basis of the embodiments of the present disclosure without creative efforts shall fall within the protection scope of the present disclosure.

The terms used in the embodiments of the present disclosure are merely for the purpose of describing specific embodiment, rather than limiting the present disclosure. The terms "a", "an", "the", and "said" in a singular form in the embodiments of the present disclosure and the attached claims are also intended to include plural forms thereof, unless noted otherwise.

It should be understood that the term "and/or" in this specification merely describes associations between associated objects, and it indicates three types of relationships. For example, A and/or B can indicate A alone, A and B, or B alone. In addition, the character "I" in this specification generally indicates that the associated objects are in an "or" relationship.

It should be understood that although the terms "first", "second", and the like can be used to describe electrodes in the embodiments of the present disclosure, the electrodes should not be limited to these terms. These terms are used only to distinguish the electrodes from each other. For example, without departing from the scope of the embodiments of the present disclosure, a first electrode can also be referred to as a second electrode, and similarly, a second electrode can also be referred to as a first electrode.

Figure 1:
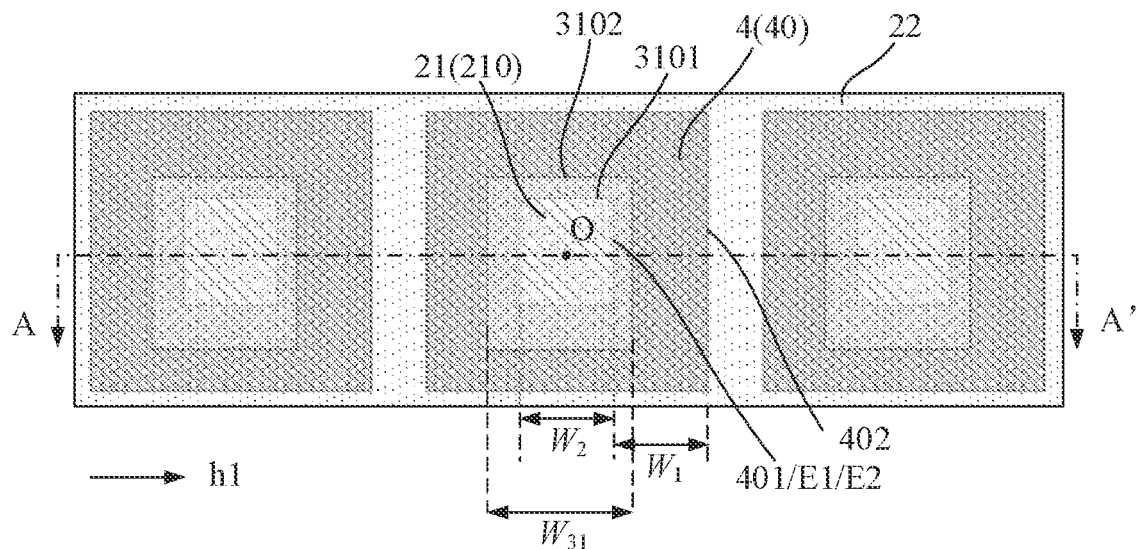
FIG. 1 is an enlarged schematic view of a partial area of a display panel according to an embodiment of the present disclosure.
Figure 2:
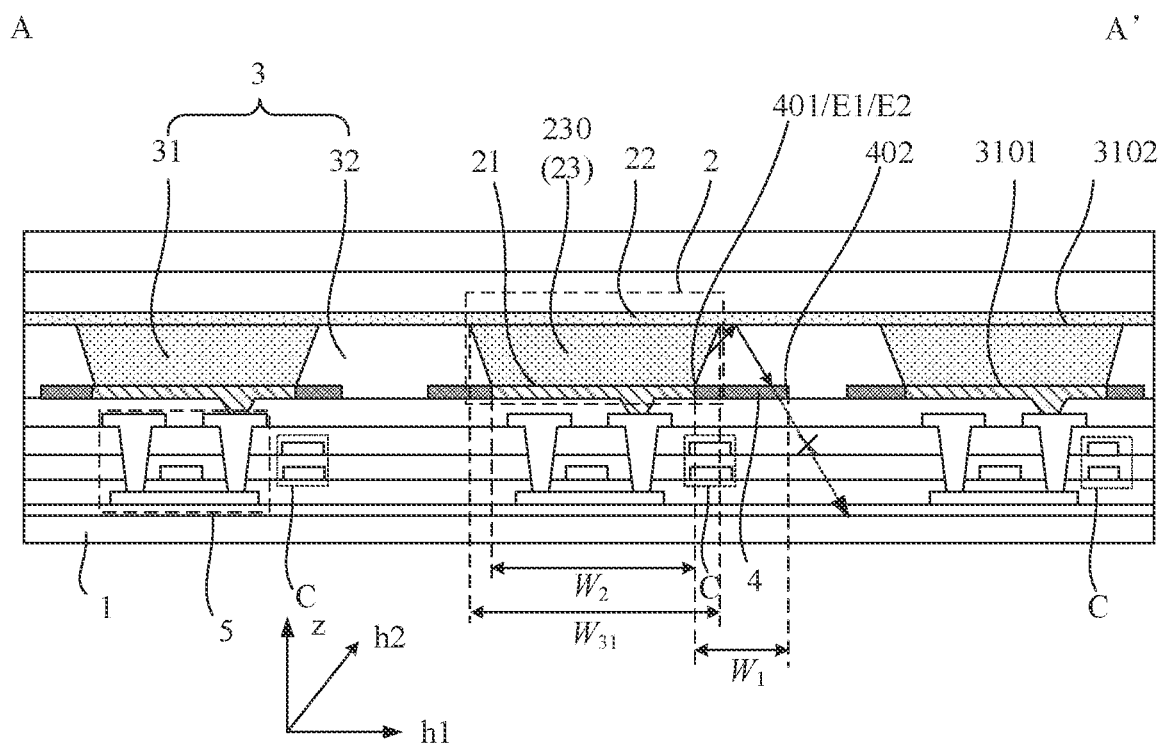
FIG. 2 is a cross-sectional view along line AA' shown in FIG. 1, according to an embodiment of the present disclosure.

Some embodiments of the present disclosure provide a display panel. FIG. 1 is an enlarged schematic view of a partial area of a display panel according to an embodiment of the present disclosure, and FIG. 2 is a cross-sectional view along line AA' shown in FIG. 1. As shown in FIG. 1 and FIG. 2, the display panel includes a substrate 1, a light-emitting unit 2, a pixel defining layer 3, and a light-shielding layer 4.

As shown in FIG. 2, the light-emitting unit 2 is located on a side of the substrate 1. The light-emitting unit 2 includes a first electrode 21 and a second electrode 22 that are opposite to each other in a direction z perpendicular to a plane of the substrate 1. The light-emitting unit 2 further includes a functional layer 23 located between the first electrode 21 and the second electrode 22. The first electrode 21 is located at a side of the functional layer 23 facing towards the substrate 1. The second electrode 22 is located at a side of the functional layer 23 facing away from the substrate 1. The functional layer 23 includes a light-emitting layer 230.

In some embodiments of the present disclosure, the display panel can be in a planar form, or at least a partial region of the display panel can be in a curved form, so that the display panel can be rolled up or folded. When at least partial area of the display panel is in a curved form, a plane of the substrate 1 in the curved form refers to a tangent plane of the substrate 1 at a corresponding position. The tangent plane is tangent to the substrate 1 in the curved form at the corresponding position.

For example, the light-emitting layer 230 includes one of an organic light-emitting material layer, an inorganic light-emitting material layer, and a quantum-dot light-emitting material layer.

In an embodiment, the first electrode 21 can be an anode, and the second electrode 22 can be a cathode. In an embodiment, the first electrode 21 can be a cathode, and the second electrode 22 can be an anode, which is not limited in the embodiments of the present disclosure.

For example, when a light-emitting side of the display panel is arranged on a side of the light-emitting unit 2 facing away from the substrate 1, the first electrode 21 can be a reflective electrode, and the second electrode 22 can be a semi-transmissive and semi-reflective electrode, so that the light-emitting unit 2 has a micro-cavity structure, and light emitted by the light-emitting unit 2 can exit smoothly from a side of the second electrode 22 facing away from the first electrode 21. A micro-cavity structure can increase a light emission rate with resonant wavelengths and suppress a light emission rate with non-resonant wavelengths, narrow an emission spectrum, increase a peak wavelength, and improve the brightness and luminous efficiency of the light-emitting unit 2.

In an embodiment, the first electrode 21 is made of at least one of Ni, Au, Ag, Pt, or Cu, and the second electrode 22 is made of at least one of Ag, Al, Ca, In, Li, or Mg.

Referring to FIG. 2, in some embodiments of the present disclosure, the pixel defining layer 3 is located between the first electrode 21 and the functional layer 23. In a manufacturing process of the display panel, the first electrode 21 can be manufactured first, then the pixel defining layer 3 is manufactured on a side of the first electrode 21 facing away from the substrate 1, and the functional layer 23 is then formed.

As shown in FIG. 2, the pixel defining layer 3 include an opening portion 31 and a non-opening portion 32. The opening portion 31 penetrates the pixel defining layer 3. The opening portion 31 includes a first opening 3101 close to the substrate 1 and a second opening 3102 away from the substrate 1. In a direction z perpendicular to a plane of the substrate 1, the first opening 3101 and the second opening 3102 at least partially overlap with each other. In some embodiments of the present disclosure, an area of the first opening 3101 is equal to or not equal to an area of the second opening 3102, which is not limited in the embodiments of the present disclosure. FIG. 1 and FIG. 2 merely exemplarily illustrate the area of the first opening 3101 is smaller than the area of the second opening 3102

In some embodiments of the present disclosure, at least a part of the light-emitting layer 230 is located in the opening portion 31. As shown in FIG. 2, in some embodiments of the present disclosure, the entire light-emitting layer 230 can be located in the opening portion 31. In some embodiments of the present disclosure, the light-emitting layer 230 can have a relatively large area, a part of the light-emitting layer 230 is located in the opening portion 31, and another part of the light-emitting layer 230 is located at a side of the non-opening portion 32 away from the substrate 1. In the manufacturing process of the display panel, after the pixel defining layer 3 with an integral layer structure is formed, a patterning process can be performed on the pixel defining layer 3, so as to form the opening portion 31 on the pixel defining layer 3. The opening portion 31 can expose the first electrode 21. After that, when the functional layer 23 including the light-emitting layer 230 is manufactured in the opening portion 31, the functional layer 23 can be in contact with the first electrode 21 through the first opening 3101.

In some embodiments of the present disclosure, a region in which the second opening 3102 is located is defined as a light-emitting region of the light-emitting unit 2 corresponding to the second opening 3102. Therefore, as the area of the second opening 3102 increases, the area of the light-emitting region of the light-emitting unit 2 corresponding to the second opening 3102 also increases.

As shown in FIG. 2, the light-shielding layer 4 is located at a side of the non-opening portion 32 of the pixel defining layer 3 facing towards the substrate 1. That is, in the direction z perpendicular to the plane of the substrate 1, the light-shielding layer 4 overlaps with the non-opening portion 32 of the pixel defining layer 3. In the direction z perpendicular to the plane of the substrate 1, the light-shielding layer 4 at least partially overlaps with the second electrode 22, and the light-shielding layer 4 does not overlap with the first opening 3101. When the area of the second opening 3102 is greater than the area of the first opening 3101, for example, as shown in FIG. 2, the light-shielding layer 4 can partially overlap with the second opening 3102 in the direction perpendicular to the plane of the substrate 1 in the embodiments of the present disclosure.

As shown in FIG. 1, an orthographic projection of the light-shielding layer 4 on the plane of the substrate 1 is defined as a first projection 40. That the light-shielding layer 4 does not overlap with the first opening 3101 in the direction z perpendicular to the plane of the substrate 1 can be regarded as that the first projection 40 does not overlap with the first opening 3101.

As shown in FIG. 2, in the direction z perpendicular to the plane of the substrate 1, the first electrode 21 of the light-emitting unit 2 is located in the opening portion 31. With reference to FIG. 1, an orthographic projection of the first electrode 21 on the plane of the substrate is defined as a second projection 210. In the direction z perpendicular to the plane of the substrate 1, the first electrode 21 is located in the opening portion 31. That is, the second projection 210 is located in the opening portion 31. In the embodiments of the present disclosure, an area of the second projection 210 is smaller than or equal to an area of the opening portion 31, so that the opening portion 31 can expose the first electrode 21, to allow the first electrode 21 to be in contact with the functional layer 23 through the opening portion 31. In an embodiment, as shown in FIG. 1 and FIG. 2, the second projection 210 can overlap with the first opening 3101 of the opening portion 31. That is, the area of the second projection 210 is equal to the area of the first opening 3101.

For example, the display panel further includes a driving circuit layer including a pixel driving circuit, and the pixel driving circuit is electrically connected to the first electrode 21. For example, as shown in FIG. 2, the pixel driving circuit includes a transistor 5 and a storage capacitor C. It should be understood that the number of the transistors 5 of the driving circuit layer can be greater than or equal to two. FIG. 2 merely shows one transistor 5 electrically connected to the first electrode 21 as an example.

When the display panel is energized to operate, the first electrode 21 and the second electrode 22 receive required electrical signals, respectively, and holes and electrons generated by the first electrode 21 and the second electrode 22 are all injected into the light-emitting layer 230. The holes and electrons are combined to generate an exciton, and the exciton radiates from an excited state to a ground state, causing the light-emitting layer 230 to emit light of a corresponding color.

In some embodiments of the present disclosure, as shown in FIG. 1 and FIG. 2, a length of the first projection 40 is $W_1$ in a first direction h1. The first direction h1 is parallel to the plane of the substrate 1. A straight line connecting any position on an edge of the first opening 3101 with a geometrical center O of the first opening 3101 is parallel to the first direction h1. As shown in FIG. 1, the first projection 40 includes a first sub-edge 401 and a second sub-edge 402 that are arranged along the first direction h1. The first sub-edge 401 is located at a side of the second sub-edge 402 close to the geometrical center O of the first opening 3101. The length of the first projection 40 in the first direction h1 can indicates a distance between the first sub-edge 401 and the second sub-edge 402 in the first direction h1. In an embodiment, the first projections 40 at different positions can have a same length in the first direction h1, or have different lengths in the first direction h1.

In some embodiments of the present disclosure, as shown in FIG. 1 and FIG. 2, the length of the second projection 210 in the first direction h1 is $W_2$, and the length of the second opening 3102 in the first direction h1 is $W_3$. FIG. 1 and FIG. 2 shown an example in which the second projection 210 and the first opening 3101 coincide, and $W_{31} > W_2$. In some embodiments of the present disclosure, a difference between $W_{31}$ and a sum of $W_1$ and $W_2$ satisfies a preset threshold.

During operation of the display panel, light emitted by the light-emitting layer 230 located in the second opening 3102 can propagate in all directions. In some embodiments of the present disclosure, as shown in FIG. 2, light emitted by the light-emitting layer 230 along a second direction h2 and transmitted towards directions other than the second opening 3102 is reflected by the second electrode 22, and the reflected light passes through a gap between two adjacent light-emitting units 2 and then propagates to the substrate 1. If this part of light exits from the substrate 1, the operation performance of the light-collecting module disposed in the display panel will be affected. Therefore, this part of light is defined as interference light hereinafter. For example, when the light-collecting module includes a camera module, if the interference light enters the camera module, a normal photographing effect of the camera module will be affected. When the light-collecting module includes a fingerprint recognition module, the interference light entering the fingerprint recognition module will generate a base value for fingerprint detection, which affects a signal-to-noise ratio of a fingerprint detection signal. In the embodiments of the present disclosure, the light-shielding layer 4 is disposed in the display panel. The light-shielding layer 4 is arranged on a propagation path of the interference light to the substrate 1, so that the light-shielding layer 4 can shield the interference light to prevent the interference light from propagating to the substrate 1, thereby preventing the interference light from affecting the normal operation of the light-collecting module disposed on the display panel.

In some embodiments of the present disclosure, as the area of the second opening 3102 increases, the intensity of the interference light emitted by the light-emitting layer 230 located in the second opening 3102 also increases. In some embodiments of the present disclosure, the first electrode 21 is made of a metal material with certain reflectivity, which can reflect received light to a side of the first electrode 21 facing away from the substrate 1. In other words, the first electrode 21 and the light-shielding layer 4 can shield the interference light jointly. Therefore, in the embodiments of the present disclosure, during setting of the length of the light-shielding layer 4, by making the difference between $W_{31}$ and the sum of $W_1$ and $W_2$ satisfy the preset threshold, an overall length of the light-shielding layer 4 and the first electrode 21 is positively correlated to the length of the second opening 3102 in the same direction after the preset threshold is set, so that the overall length of the light-shielding layer 4 and the first electrode 21 matches the length of the second opening 3102, thereby effectively shielding the interference light emitted by the light-emitting layer 230 located in the second opening 3102. In the embodiments of the present disclosure, by making the difference between $W_{31}$ and the sum of $W_1$ and $W_2$ satisfy the preset threshold, the length of the light-shielding layer 4 is negatively correlated to the length of the first electrode 21 in the same direction, so that the shielding effect of the original first electrode 21 in the display panel for the interference light is fully utilized while the interference light emitted by the light-emitting layer 230 located in the second opening 3102 is sufficiently shield, thereby avoiding setting an excessively large length of the light-shielding layer 4 to occupy too much space in the display panel.

In some embodiments of the present disclosure, the setting of the preset threshold can be adjusted with reference to the specifications of the light-collecting module matching the display panel. For example, when the light-collecting module has a high degree of precision, the preset threshold can be set to a large value, so that the total length of the light-shielding layer 4 and the first electrode 21 in the first direction h1 is large enough to reflect more interference light to a side of the second electrode 22 away from the first electrode 21, to avoid that the interference light propagates from the side of the substrate 1 of the display panel to the light-collecting module.

It can be seen from the analysis above the, with the light-shielding layer 4, the interference light emitted from the light-emitting unit 2 to the side of the substrate 1 can be shield, to prevent the interference light from propagating to the light-collecting module located at a side of the substrate 1 facing away from the light-emitting unit 2, thereby improving the operation performance of the light-collecting module. In some embodiments of the present disclosure, by taking the lengths of the light-shielding layer 4, the first electrode 21, and the second opening 3102 in the first direction h1 into consideration, the difference between the length $W_{31}$ of the second opening 3102 and the sum of the length $W_1$ of the first projection 40 and the length $W_2$ of the second projection 210 satisfies the preset threshold. That is, the difference between the length $W_{31}$ of the second opening 3102 and the sum of the length $W_1$ of the first projection 40 and the length $W_2$ of the second projection 210 is calculated, and the difference satisfies the preset threshold. In this way, the length of the light-shielding layer 4 is correlated to the lengths of the second projection 210 and the second opening 3102. In other words, in the embodiments of the present disclosure, the length of the first projection 40 (that is, the light-shielding layer 4) in the same direction can be set according to the lengths of the second projection 210 and the second opening 3102, to reduce the intensity of interference light emitted from the side of the substrate 1 and ensure normal operation performance of the light-collecting module while making the sum of the length of the light-shielding layer 4 and the length of the second projection 210 match the length of the second opening 3102, which can avoid setting an excessively large length of the light-shielding layer 4, so that the light-shielding layer 4 does not occupy too much space in the display panel. It is ensured that the ambient light can still propagate between two adjacent light-emitting units 20 and reach the light-collecting module through the side of the substrate 1, thereby ensuring normal lighting of the light-collecting module.

For example, the light-shielding layer 4 includes a metal layer. In an embodiment, the metal layer is made of at least one of Ni, Au, Ag, Pt, or Cu. In the embodiments of the present disclosure, a metal material is selected to form the light-shielding layer 4, to reflect light transmitted to the light-shielding layer 4. While the intensity of the interference light emitted from the substrate 1 is reduced, at least a part of light reflected by the light-shielding layer 4 can exit through the second electrode 22, which helps improve the brightness of the display panel.

In some embodiments of the present disclosure, the light-shielding layer 4 can include a light-absorbing material. In this way, the interference light transmitted to the light-shielding layer 4 can be absorbed and does not exit from the substrate 1. In an embodiment, the light-absorbing material includes a light-absorbing metal material and/or organic layer. For example, the metal material includes Cr. The organic layer can include black resin, ink, or opaque resin.

During setting of the first projection 40 and the second projection 210, for example, as shown in FIG. 1, a first edge E1 of the first projection 40 and a second edge E2 of the second projection 210 coincide. The first edge E1 is an edge of the first projection 40 close to the second projection 210, and the first edge E1 and the first sub-edge 401 coincide. The second edge E2 is an edge of the second projection 210 close to the first projection 40. In other words, there is no gap between the first projection 40 and the second projection 210. In this way, partial interference light emitted by the light-emitting layer 230 and reflected by the second electrode 22 will not propagate to the substrate 1 from a corresponding position of the gap between the first projection 40 and the second projection 210, so as to minimize the intensity of interference light emitted from the side of the substrate 1 and ensure the operation characteristics of the light-collecting module disposed corresponding to the display panel.

In an embodiment, in the direction perpendicular to the plane of the substrate, the first electrode 21 and the light-shielding layer 4 at least partially overlap with each other, which can ensure that there is no gap between the first projection 40 and the second projection 210. In a first case where the first edge and the second edge completely coincide, "the sum of the length of the first projection and the length of the second projection" can be understood as W1+W2. In a second case where the orthographic projection of the first electrode partially overlaps with the orthographic projection of the light-shielding layer can be understood as a difference between a sum of W1 and W2 (i.e., W1+W2) and a length of the overlapping part between the orthographic projections of the first electrode and the light-shielding layer. The subsequent embodiments of the present disclosure are all described with reference to the first case, but the subsequent embodiments are also applicable to the second case, which will not be repeated herein.

For example, the first projection 40 can at least partially surround the second projection 210. FIG. 1 is a schematic view in which the first projection 40 is ring-shaped, and the first projection 40 surrounds the second projection 210. In this way, the light-emitting layer 230 emits light and the light is reflected by the second electrode 22 to a side of the substrate 1 to form interference light, and the light-shielding layer 4 can shield the interference light in multiple directions, thereby reducing the intensity of the interference light emitted from the side of the substrate 1.

When setting of the light-shielding layer 4, in an embodiment, as shown in FIG. 2, the light-shielding layer 4 and the first electrode 21 are arranged in a same layer and are made of a same material, so that the first electrode 21 and the light-shielding layer 4 are formed in a same process during manufacturing of the display panel, to simplify the manufacturing process of the display panel.

In some embodiments of the present disclosure, by setting the light-shielding layer 4 and the first electrode 21 in the same layer, the interference light is prevented from propagating to the transistor 5 in the driving circuit layer, thereby avoiding a change in the electrical characteristics of the transistor 5 under the effect of illumination.

For example, when the light-shielding layer 4 and the first electrode 21 are set in the same layer, the light-shielding layer 4 can be connected to the first electrode 21. In this way, the gap between the light-shielding layer 4 and the first electrode 21 can be eliminated, so that the light-shielding layer 4 and the first electrode 21 as a whole can shade more interference light.

Figure 3:
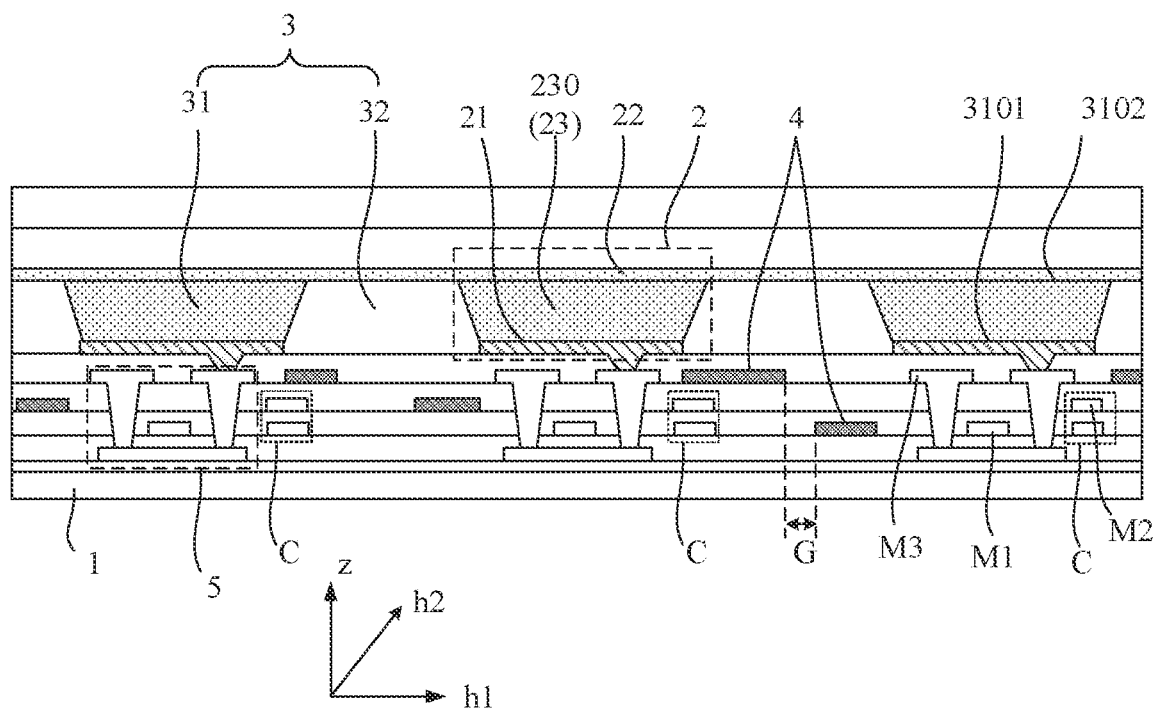
FIG. 3 is a cross-sectional view of a display panel according to an embodiment of the present disclosure.

In some embodiments, the light-shielding layer 4 and at least one layer that is located in the driving circuit layer are arranged in a same layer. FIG. 3 is a cross-sectional view of a display panel according to an embodiment of the present disclosure. As shown in FIG. 3, the driving circuit layer includes a first metal layer M1, a second metal layer M2, and a third metal layer M3, and the second metal layer M2 is located between the first metal layer M1 and the third metal layer M3. In some embodiments of the present disclosure, two electrode plates of the storage capacitor C can be disposed in any two of the first metal layer M1, the second metal layer M2, and the third metal layer M3, respectively. FIG. 3 schematically shows that the two electrode plates of the storage capacitor C are formed in the first metal layer M1 and the second metal layer M2, respectively. A gate of the transistor 5 is further disposed in the first metal layer M1. A source and a drain of the transistor 5 are disposed in the third metal layer M3. In an embodiment, the light-shielding layer 4 can be located in any one of the first metal layer M1, the second metal layer M2, and the third metal layer M3, and the light-shielding layer 4 is made of a same material as the first metal layer M1, the second metal layer M2, or the third metal layer M3, so that the manufacturing process of the light-shielding layer 4 is integrated in the manufacturing of the transistor 5 or the storage capacitor C, thereby simplifying the manufacturing process of the display panel.

FIG. 3 merely schematically shows a layer structure of the driving circuit layer. In the actual design of the display panel, more metal layers can be set in the driving circuit layer according to different design requirements of the display panel, which is not limited in the embodiments of the present disclosure.

For example, FIG. 3 schematically shows that multiple light-shielding layers 4 are disposed in the display panel, at least one light-shielding layer 4 is located in the first metal layer M1, and another at least one light-shielding layer 4 is located in the second metal layer M2.

In some embodiments, as shown in FIG. 3, when the light-shielding layer 4 is disposed in the first metal layer M1 or the second metal layer M2 different from the first electrode 21, the first projection corresponding to the light-shielding layer 4 and the edge of the second projection corresponding to the first electrode 21 coincide, so that the interference light does not exit from the gap between the light-shielding layer 4 and the first electrode 21.

For example, as shown in FIG. 3, when multiple light-shielding layers 4 corresponding to different light-emitting units 2 are disposed in the display panel, there can be a gap G between two adjacent light-shielding layers 4 corresponding to two adjacent light-emitting units 2. In this way, when the light-collecting module is disposed on a side of the substrate 1 facing away from the light-emitting unit 2, external ambient light can be incident to the light-collecting module through the gap G, which can ensure normal lighting of the light-collecting module.

In some embodiments, the light-shielding layer 4 includes a reflective layer. When setting the length of the light-shielding layer 4, in some embodiments of the present disclosure, the length $W_1$ of the first projection, the length $W_2$ of the second projection, and the length $W_{31}$ of the second opening 3102 in the first direction h1 satisfy the following relationship:

$$W_1 + W_2 - W_{31} \geq 2 \times (m-1) \times L \times \tan\left[\arcsin\left(\frac{n_1}{n_2}\right)\right], \quad (1)$$

where m denotes a critical number of times that light emitted by the light-emitting layer 230 is reflected by the second electrode 22 when a preset condition is met, L denotes a distance between the light-shielding layer 4 and the second electrode 22 in the direction perpendicular to the plane of the substrate, $n_1$ denotes a refractive index of the second electrode 22, $n_2$ denotes a refractive index of a functional layer 23 between the light-shielding layer 4 and the second electrode 22. In the embodiments of the present disclosure, unless otherwise specified, a distance between two structures is a distance between opposite surfaces of the two structures.

Figure 4:
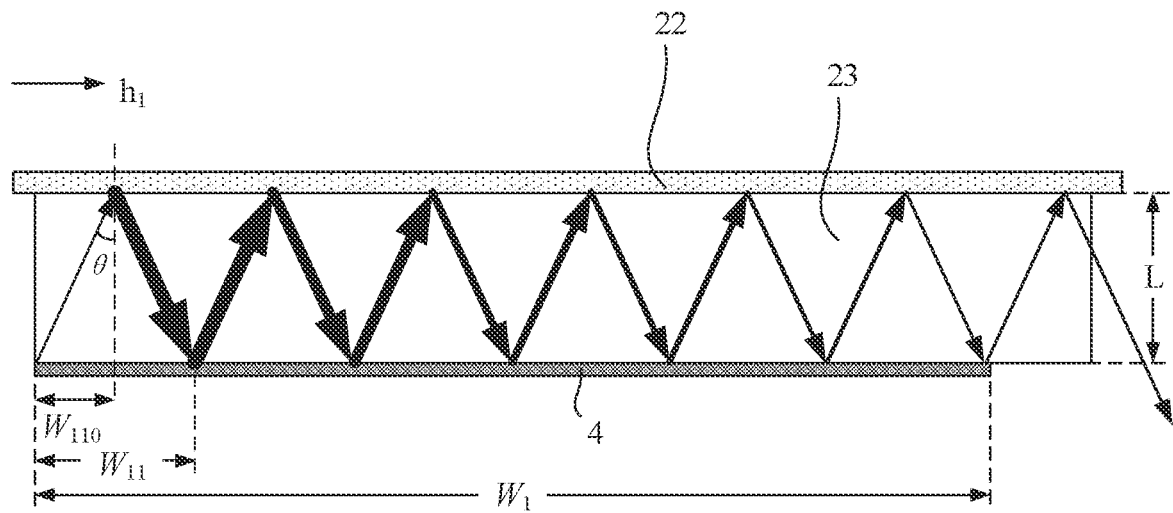
FIG. 4 is a schematic diagram of an optical path on which light emitted from a light-emitting layer is reflected between a light-shielding layer and a second electrode according to an embodiment of the present disclosure

In some embodiments of the present disclosure, the second electrode 22 is a semi-transmissive and semi-reflective material. When the interference light is reflected back and forth between the light-shielding layer 4 and the second electrode 22, the intensity of the interference light reflected by the second electrode 22 will be attenuated gradually. FIG. 4 is a schematic diagram of an optical path on which light emitted from a light-emitting layer is reflected between a light-shielding layer and a second electrode according to an embodiment of the present disclosure. The arrows in FIG. 4 illustrate the light propagation direction, and the thickness of the arrowed line segment is used for describing relative light intensity.

As shown in FIG. 4, to allow light emitted by the light-emitting layer (not shown in FIG. 4) to be reflected by the second electrode 22 twice, the length of the light-shielding layer 4 is $W_{11}=2W_{110}$. Taking the interference light satisfying the preset condition after light is reflected by the second electrode 22 for m times, the length of the light-shielding layer 4 is $(m-1) \times W_{11}$ if light emitted by the light-emitting layer is reflected by the second electrode 22 twice.

After the light is reflected by the second electrode 22 once, the light intensity will be attenuated by certain degree. When the reflectivity of the second electrode 22 is R, after the interference light is reflected by the second electrode 22 for m times, a ratio of reflected light intensity to incident light intensity is $R^m$, where the incident light intensity is light intensity when the light emitted by the light-emitting layer is not reflected by the second electrode 22. When $R^m$ is smaller than a certain value, the impact of the interference light on the light-collecting module is small enough, and can be ignored.

As shown in FIG. 4, $W_{110} = L \times \tan \theta$, where $\theta$ is an incident angle when the interference light is incident on the second electrode 22. When the incident angle $\theta$ is greater than a critical angle $\theta c$, the interference light is totally reflected after being incident on the second electrode 22, and the reflected light has maximum intensity in this case. For example, when the interference light is incident on the surface of the second electrode 22 at the critical angle $\theta c$, to allow the interference light to be totally reflected for m times on the surface of the second electrode 22, the length of the light-shielding layer 4 is $W_{1c}$, where $W_{1c}$ satisfies the following relationship:

$$W_{1c} = 2 \times (m-1) \times L \times \tan \theta_c \quad (2),$$

where $$\theta_c = \arcsin\left(\frac{n_1}{n_2}\right),$$

and by substituting $$\theta_c = \arcsin\left(\frac{n_1}{n_2}\right)$$

into formula (2), it can be obtained that:

$$W_{1c} = 2 \times (m-1) \times L \times \tan\left[\arcsin\left(\frac{n_1}{n_1}\right)\right]. \quad (3)$$

In the embodiments of the present disclosure, the length $W_1$ of the first projection, the length $W_2$ of the second projection, and the length $W_{31}$ of the second opening 3102 satisfy the following relationship: $W_1 + W_2 - W_{31} \geq W_{1c}$, to ensure that the light-shielding layer 4 and the first electrode 21 as a w % bole can reflect the interference light emitted by the light-emitting layer 230 for multiple times, and ensure that the light meets the preset condition after being reflected by the second electrode 22 for m times.

In the design process of the display panel, when the lengths of the second electrode 21 and the second opening 3102 are known and the refractive indexes of the second electrode 22 and the functional layer 23 are determined, the length of the light-shielding layer 4 can be designed according to formula (1).

For example, the preset condition includes a requirement on the intensity of light reflected by the second electrode 22. In the embodiments of the present disclosure, the requirement on the intensity of light reflected by the second electrode 22 can be adjusted according to the specifications of the light-collecting module to be set. For example, in the embodiments of the present disclosure, the preset condition can include:

$$\frac{A_1}{A_2} \leq 1\%,$$

where the light-emitting layer 230 emits first light, and the first light is reflected by the second electrode 22 to form second light. $A_1$ denotes the intensity of the second light, and $A_2$ denotes the intensity of the first light.

For example, $$m = \log_R\left(\frac{A_1}{A_2}\right),$$

where the light-emitting layer 230 emits first light, and the first light is reflected by the second electrode 22 to form second light, R denotes a reflectivity of the second electrode 22, $A_1$ denotes the intensity of the second light, and $A_2$ denotes the intensity of the first light.

For example, $$L = k \times \frac{\lambda}{2},$$

where k is a positive integer, and $\lambda$ denotes a peak value of a wavelength of light emitted by the light-emitting layer 230.

In some embodiments of the present disclosure, k=2, to ensure that the micro-cavity structure increases the light-emitting efficiency of the light-emitting unit 2 while avoiding setting an excessively large distance between the first electrode 21 and the second electrode 22, that is, avoiding setting an excessively large thickness of the functional layer 23 to cause a waste of materials. In this way, it can also avoid setting an excessively small thickness of the functional layer 23, which is more helpful to control the preparation yield of the film layer.

Figure 5:
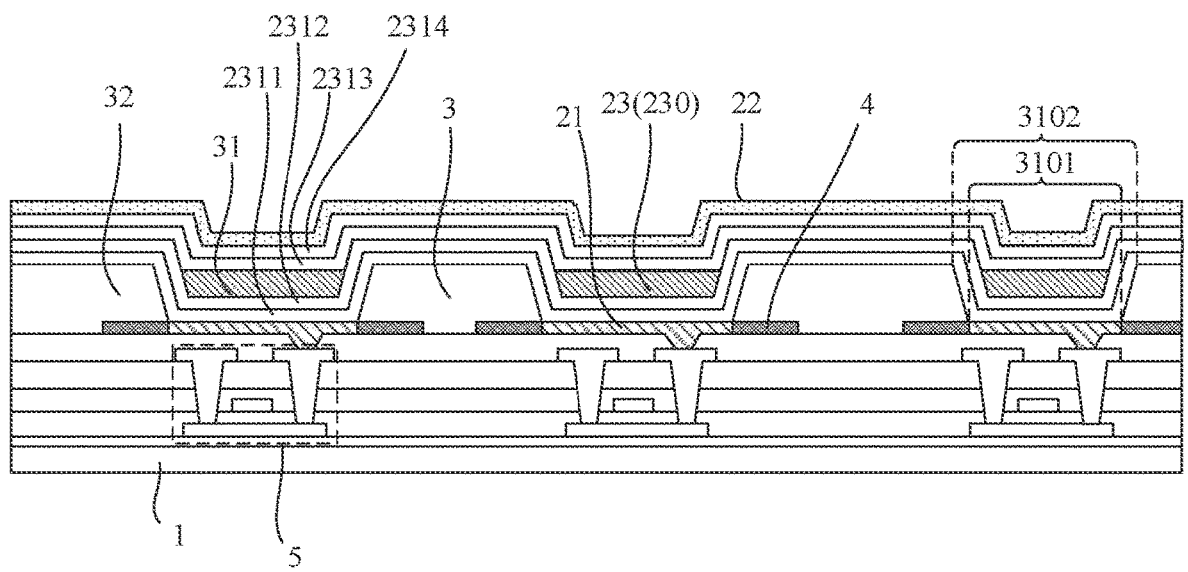
FIG. 5 is a cross-sectional view of a display panel according to an embodiment of the present disclosure.

For example, the functional layer 23 further includes a common layer, and the common layer includes at least one of a hole transport layer, a hole injection layer, an electron transport layer, or an electron injection layer. FIG. 5 is a cross-sectional view of a display panel according to an embodiment of the present disclosure. FIG. 5 schematically shows that the common layer includes a hole injection layer 2311, a hole transport layer 2312, an electron transport layer 2313, and an electron injection layer 2314. The common layer can increase the injection and transport efficiency of carriers, which helps to improve the light-emitting performance of the light-emitting unit 2.

In some embodiments of the present disclosure, common layers corresponding to different light-emitting units 2 can be connected to each other. In some embodiments of the present disclosure, as shown in FIG. 5, in the direction perpendicular to the plane of the substrate 1, the common layer can at least partially overlap with the light-shielding layer 4. In some embodiments of the present disclosure, during manufacturing of the display panel, the common layers in the display panel can be manufactured in a uniform manner by using a mask plate with a relatively large opening, which can reduce the difficulty of the manufacturing process of the display panel while increasing the carrier recombination efficiency.

It some embodiments of the present disclosure, the functional layer 23 located between the first electrode 21 and the second electrode 22 can be a single-layer structure, or can be a stacking layer formed by multiple layers stacked together. When the functional layer 23 adopts the stacking layer formed by multiple layers stacked together, $n_2$ representing the refractive index of the functional layer 23 in the foregoing formula (1) is an equivalent refractive index of the multiple layers of the stacking structure.

Figure 6:
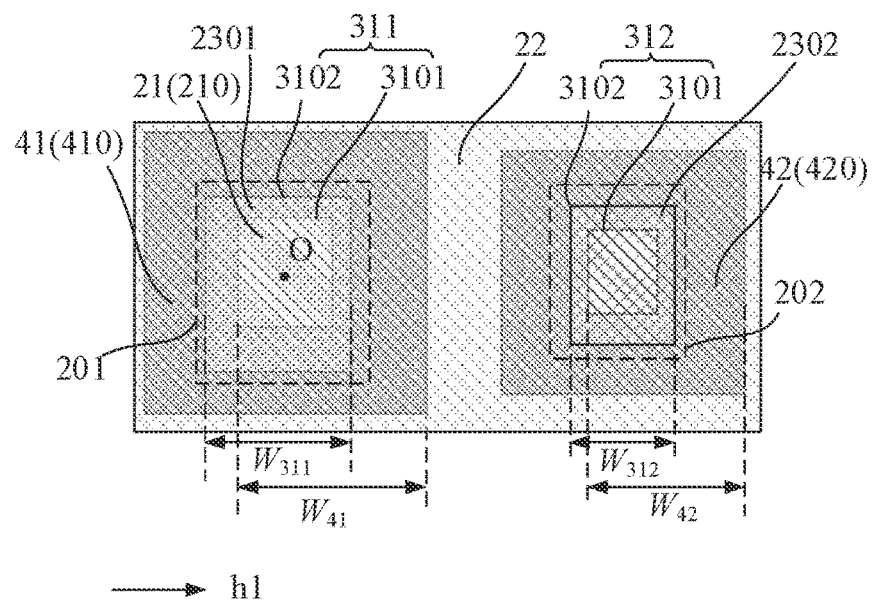
FIG. 6 is a schematic top view of a display panel according to an embodiment of the present disclosure.

FIG. 6 is a top view of a display panel according to an embodiment of the present disclosure. For example, as shown in FIG. 6, in the display panel, the light-emitting units 2 include a first-color light-emitting unit 201 and a second-color light-emitting unit 202. The first-color light-emitting unit 201 includes a first-color light-emitting layer 2301 configured to emit light of a first color. The second-color light-emitting unit 202 includes a second-color light-emitting layer 2302 configured to emit light of a second color. In some embodiments of the present disclosure, the first color is different from the second color. For example, the first color and the second color can be any two of red, green, and blue.

Referring to FIG. 6, the opening portion 31 includes a first opening portion 311 and a second opening portion 312. At least a part of the first-color light-emitting layer 2301 is located in the first opening portion 311, and at least a part of the second-color light-emitting layer 2302 is located in the second opening portion 312.

In some embodiments of the present disclosure, an area of the first opening portion 311 and an area of the second opening portion 312 can be equal to each other, or not equal to each other, which is not limited in the embodiments of the present disclosure. FIG. 6 schematically shows that the area of the first opening portion 311 and the area of the second opening portion 312 are not equal to each other. In this case, that the area of the first opening portion 311 and the area of the second opening portion 312 are not equal to each other indicates that: an area of a first opening of the first opening portion 311 is not equal to an area of a first opening of the second opening portion 312, and an area of a second opening of the first opening portion 311 is not equal to an area of a second opening of the second opening portion 312.

Referring to FIG. 6, the light-shielding layer 4 includes a first light-shielding layer 41 and a second light-shielding layer 42. In the embodiments of the present disclosure, a first-color light-emitting layer 2301, the first opening portion 311, and the first light-shielding layer 41 correspond to each other in a one-to-one correspondence. A second-color light-emitting layer 2302, the second opening portion 312, and the second light-shielding layer 42 correspond to each other in a one-to-one correspondence.

As shown in FIG. 6, an orthographic projection of the first light-shielding layer 41 on the plane of the substrate 1 is a first sub-projection 410, and an orthographic projection of the second light-shielding layer 42 on the plane of the substrate 1 is a second sub-projection 420. In some embodiments of the present disclosure, in the first direction h1, a sum of a length of the first sub-projection 410 and the length of the second projection 210 is $W_{41}$, and a length of the second opening 3102 of the first opening portion 311 is $W_{311}$. A sum of a length of the second sub-projection 420 and the length of the second projection is $W_{42}$, and a length of the second opening 3102 of the second opening portion 312 is $W_{312}$, $W_{41}-W_{311} \neq W_{42}-W_{312}$.

Light-emitting layers with different colors emit light having different wavelengths. Correspondingly, light-emitting units corresponding to the light-emitting layers with different colors have different micro-cavity lengths. In the embodiments of the present disclosure, the difference between the overall length of the light-shielding layer 4 and the first electrode 21 and the length of the second opening 3102 is set differently according to the color of light emitted by the light-emitting unit 2, so that the length of the light-shielding layer 4 matches the color of light emitted by the corresponding light-emitting unit 2, and the light-shielding layer 4 can have a maximum light-shielding effect for interference light of different colors.

Figure 7:
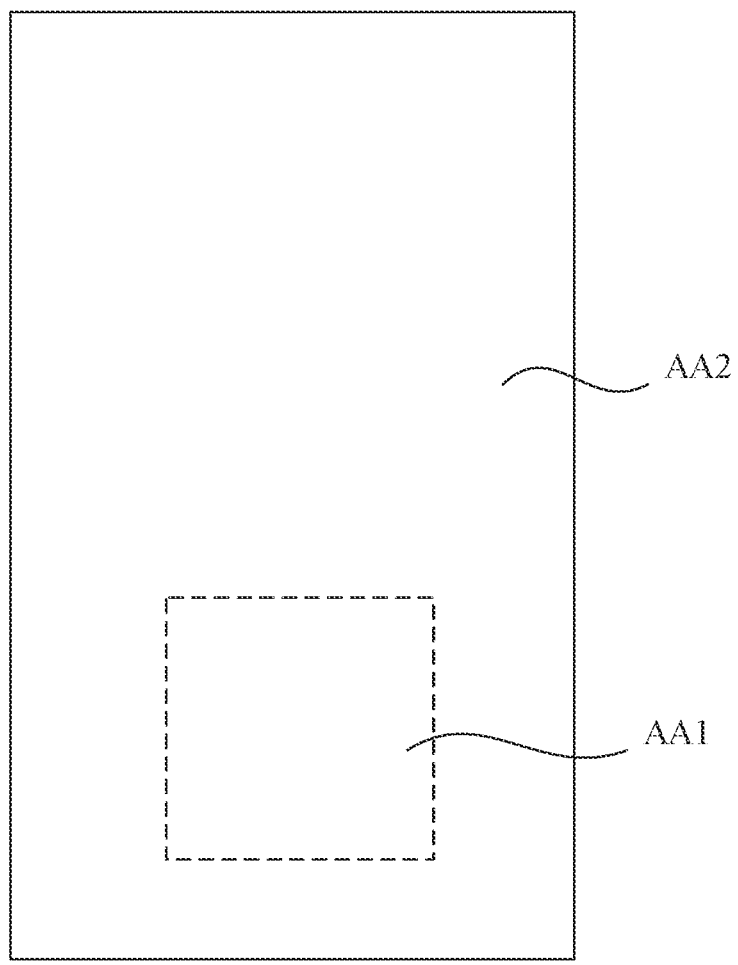
FIG. 7 is a schematic top view of a display panel according to an embodiment of the present disclosure.

FIG. 7 is a schematic top view of a display panel according to an embodiment of the present disclosure. For example, as shown in FIG. 7, the display panel has a first display region AA1 and a second display region AA2, and the first display region AA1 and the second display region AA2 each is provided with the light-emitting units (not shown in FIG. 7). In some embodiments of the present disclosure, light transmittance of the first display region AA1 is greater than or equal to light transmittance of the second display region AA2. For example, a density of the light-emitting units in the first display region AA1 can be smaller than or equal to a density of the light-emitting units in the second display region AA2, so that the light transmittance of the first display region AA1 is different from the light transmittance of the second display region AA2.

In some embodiments of the present disclosure, the display panel includes a light-collecting module disposed corresponding to the second display region AA2. That is, an orthographic projection of the light-collecting module on the plane of the substrate 1 is located in the second display region AA2, to increase the intensity of external ambient light entering the light-collecting module.

Figure 8:
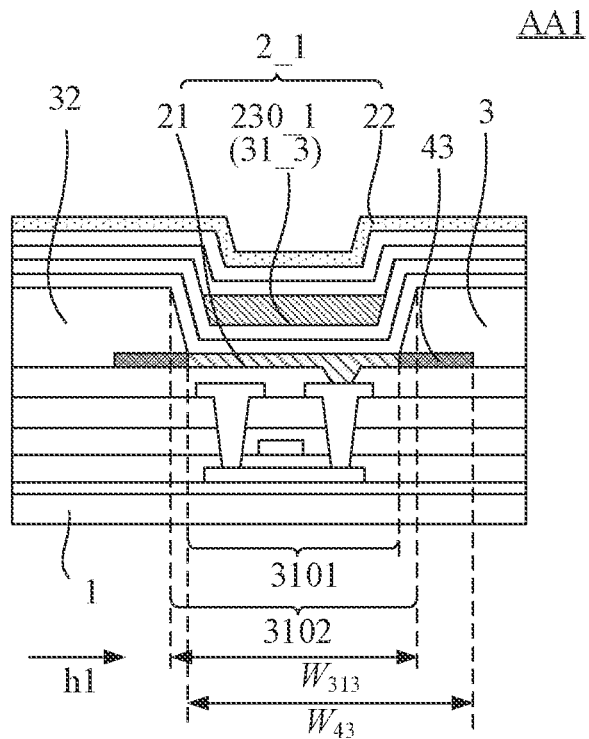
FIG. 8 is a cross-sectional view of a partial area of a first display region according to an embodiment of the present disclosure.

FIG. 8 is a cross-sectional view of a partial area of a first display region according to an embodiment of the present disclosure. As shown in FIG. 8, a first light-emitting unit 21 is disposed in the first display region AA1 and includes a first light-emitting layer 230_1, the opening portion includes a third opening portion 31_3 where at least a part of the first light-emitting layer 230_1 is located. The light-shielding layer includes a third light-shielding layer 43. The third light-shielding layer 43 corresponds to the third opening portion 31_3. An orthographic projection of the third light-shielding layer 43 on the plane of the substrate 1 is a third sub-projection. In some embodiments of the present disclosure, in the first direction h1, a sum of a length of the third sub-projection and a length of the corresponding second projection is $W_{43}$, and a length of the second opening 3102 of the third opening portion 31_3 is $W_{313}$.

Figure 9:
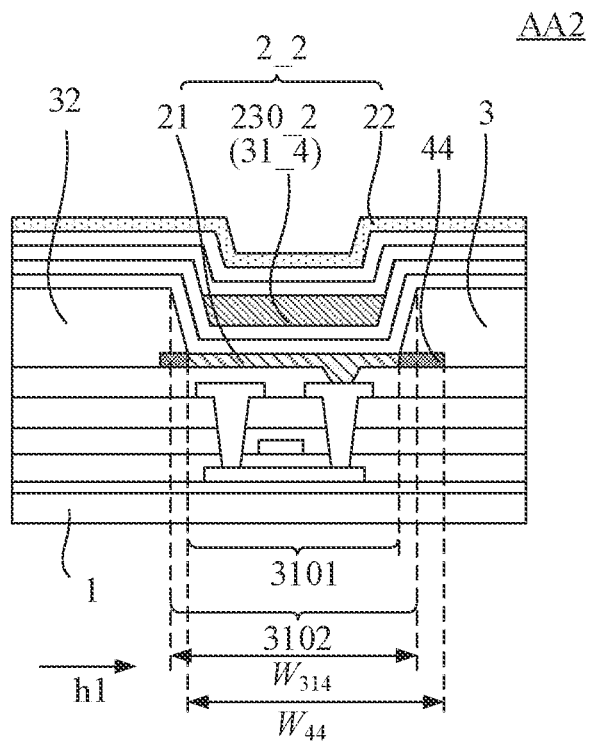
FIG. 9 is a cross-sectional view of a partial area of a second display region according to an embodiment of the present disclosure.

FIG. 9 is a cross-sectional view of a partial area of a second display region according to an embodiment of the present disclosure. As shown in FIG. 9, A second light-emitting unit 2_2 is arranged in the second display region AA2 and includes a second light-emitting layer 230_2. The opening portion includes a fourth opening portion 31_4 where at least a part of the second light-emitting layer 230_2 is located. The light-shielding layer includes a fourth light-shielding layer 44, and the fourth light-shielding layer 44 corresponds to the fourth opening portion 31_4. An orthographic projection of the fourth light-shielding layer 44 on the plane of the substrate 1 is a fourth sub-projection. In the embodiments of the present disclosure, a sum of a length of the fourth sub-projection and a length of the corresponding second projection is $W_{44}$, and a length of the second opening 3102 of the fourth opening portion 31 is $W_{314}$.

In some embodiments of the present disclosure, $W_{43}-W_{313} \neq W_{44}-W_{314}$. In the embodiments of the present disclosure, $W_{43}-W_{313} < W_{44}-W_{314}$. That is, there is a large difference between the length of the second opening 3102 and a sum of a length of the fourth light-shielding layer 44 in the second display region AA2 and a length of the corresponding second electrode 21, so that the fourth light-shielding layer 44 in the second display region AA2 can shield more interference light, thereby ensuring the operation performance of the light-collecting module disposed corresponding to the second display region AA2.

In some embodiments of the present disclosure, the first light-emitting layer 230_1 and the second light-emitting layer 230_2 emit light of a same color. For example, the first light-emitting layer 230_1 and the second light-emitting layer 2302 emit any one of red light, green light, and blue light.

In some embodiments of the present disclosure, the first light-emitting layer 230_1 and the second light-emitting layer 230_2 emit light of different color. For example, the first light-emitting layer 230_1 emits red light, and the second light-emitting layer 230_2 emits green light or blue light. As described above, due to different wavelengths of light having different colors, in some embodiments of the present disclosure, the difference between the overall length of the light-shielding layer 4 and the first electrode 21 and the length of the second opening 3102 is set differently according to the color of light emitted by the light-emitting unit 2, so that the length of the light-shielding layer 4 matches the color of light emitted and by the corresponding light-emitting unit 2, and the light-shielding layer 4 can have a maximum light-shielding effect for interference light of different colors.

Figure 10:
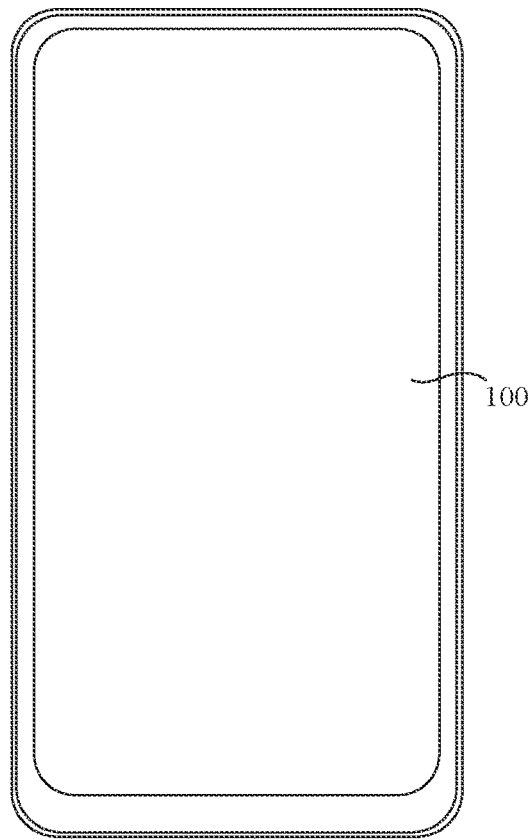
FIG. 10 is a schematic view of a display apparatus according to an embodiment of the present disclosure.

Some embodiments of the present disclosure further provide a display apparatus. FIG. 10 is a schematic view of a display apparatus according to an embodiment of the present disclosure. As shown in FIG. 10, the display apparatus includes the foregoing display panel 100. The structure of the display panel 100 has been described in detail in the foregoing embodiments. Details are not repeated herein. The display apparatus shown in FIG. 10 is for schematic description only. The display apparatus can be any electronic device with a display function, such as a mobile phone, a tablet computer, a notebook computer, an e-book, or a television.

Figure 11:
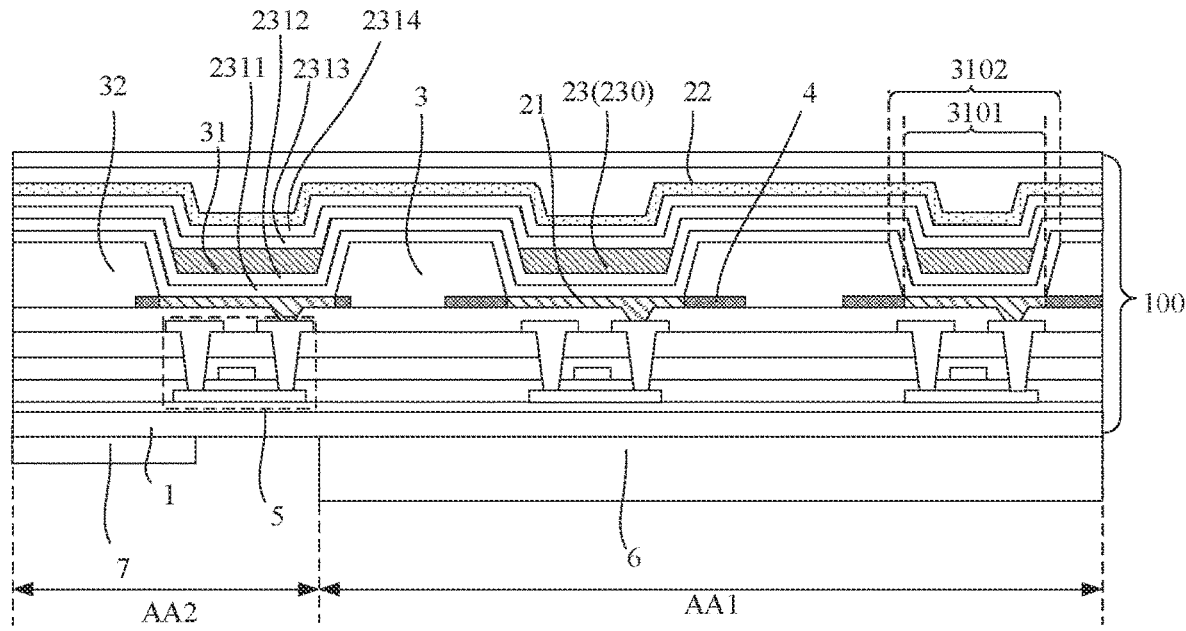
FIG. 11 is a cross-sectional view of a display apparatus according to an embodiment of the present disclosure.

FIG. 11 is a cross-sectional view of a display apparatus according to an embodiment of the present disclosure. For example, as shown in FIG. 11, the display apparatus further includes a light-collecting module 6 located at a side of the substrate 1 facing away from the light-emitting unit 2. In an embodiment, with reference to FIG. 7 and FIG. 11, the display panel has a first display region AA and a second display region AA2, and light transmittance of the first display region AA1 is greater than or equal to light transmittance of the second display region AA2. An orthographic projection of the light-collecting module 6 on a plane of the substrate 1 is located in the first display region AA1.

For example, the light-collecting module 6 includes a fingerprint recognition module and/or a camera module.

As shown in FIG. 11, the display apparatus further includes a copper foil 7, and the copper foil 7 and the light-collecting module 6 are located at a same side of the substrate 1. The copper foil 7 can conduct static electricity away from the display panel in time to protect the display panel 100 from static electricity damage. For example, a via can be provided in the copper foil 7, and the light-collecting module 6 is disposed in the via to ensure normal light-collecting of the light-collecting module 6. For example, as shown in FIG. 11, the copper foil 7 is located in the second display region AA2.

The above merely illustrates some embodiments of the present disclosure and is not intended to limit the present disclosure. Any modifications, equivalent replacements, improvements, and the like made within the principle of the present disclosure shall fall within the protection scope of the present disclosure.

What is claimed is:

1. A display panel, comprising:
a substrate;
at least one light-emitting unit, wherein one of the at least one light-emitting unit comprises a first electrode and a second electrode that are opposite to each other, and a functional layer located between the first electrode and the second electrode, wherein the first electrode is located at a side of the functional layer facing towards the substrate, and the functional layer comprises a light-emitting layer;
a pixel defining layer located between the first electrode and the functional layer, wherein the pixel defining layer comprises an opening portion and a non-opening portion, at least a part of the light-emitting layer is located in the opening portion; in a direction perpendicular to a plane of the substrate, the first electrode is located in the opening portion; and the opening portion comprises a first opening close to the substrate and a second opening away from the substrate; and
a light-shielding layer located at a side of the non-opening portion facing towards the substrate, wherein in the direction perpendicular to the plane of the substrate, the light-shielding layer at least partially overlaps with the second electrode, and does not overlap with the first opening;
wherein an orthographic projection of the light-shielding layer on the plane of the substrate is a first projection; an orthographic projection of the first electrode on the plane of the substrate is a second projection; a difference between a length of the second opening in a first direction and a sum of a length of the first projection in the first direction and a length of the second projection in the first direction satisfies a preset threshold; and the first direction is parallel to the plane of the substrate, and a straight line connecting each position on an edge of the first opening with a geometrical center of the first opening is parallel to the first direction.

2. The display panel according to claim 1, wherein an edge of the first projection close to the second projection is a first edge, an edge of the second projection close to the first projection is a second edge, and the first edge and the second edge coincide.

3. The display panel according to claim 1, wherein in the direction perpendicular to the plane of the substrate, the first electrode partially overlaps with the light-shielding layer.

4. The display panel according to claim 1, wherein the at least one light-emitting unit comprises at least two light-emitting units, wherein two adjacent light-emitting units of the at least two light-emitting units corresponds to two parts of the light-shielding layer, and a gap is formed between the two parts of the light-shielding layer.

5. The display panel according to claim 1, wherein the first projection has a length $W_1$ in the first direction, the second projection has a length $W_2$ in the first direction, the second opening has a length $W_{31}$ in the first direction, and $$W_1 + W_2 - W_{31} \geq 2 \times (m-1) \times L \times \tan\left[\arcsin\left(\frac{n_1}{n_2}\right)\right],$$

where m denotes a critical number of times that light emitted by the light-emitting layer is reflected by the second electrode when a preset condition is met, L denotes a distance between the light-shielding layer and the second electrode in the direction perpendicular to the plane of the substrate; $n_1$ denotes a refractive index of the second electrode; and $n_2$ denotes a refractive index of the functional layer that is located between the light-shielding layer and the second electrode.

6. The display panel according to claim 5, wherein the preset condition comprises:

$$\frac{A_1}{A_2} \leq 1\%,$$

wherein the light-emitting layer emits first light, and the first light is reflected by the second electrode to form second light, $A_1$ denotes intensity of the second light, and $A_2$ denotes intensity of the first light.

7. The display panel according to claim 5, wherein $$m = \log_R\left(\frac{A_1}{A_2}\right),$$

wherein the light-emitting layer emits first light, and the first light is reflected by the second electrode to form second light, R denotes reflectivity of the second electrode, $A_1$ denotes intensity of the second light when the preset condition is met, and $A_2$ denotes intensity of the first light.

8. The display panel according to claim 5, wherein $$L = k \times \frac{\lambda}{2},$$

where k is a positive integer, and λ denotes a peak value of a wavelength of light emitted by the light-emitting layer.

9. The display panel according to claim 8, wherein k=2.

10. The display panel according to claim 1, wherein the light-shielding layer comprises a metal layer.

11. The display panel according to claim 10, wherein the light-shielding layer and the first electrode are arranged in a same layer.

12. The display panel according to claim 10, further comprising:
a driving circuit layer located between the substrate and the first electrode, wherein at least a part of the light-shielding layer is located in a same layer as at least one metal layer of the driving circuit layer.

13. The display panel according to claim 1, wherein the light-shielding layer comprises a light-absorbing material.

14. The display panel according to claim 13, wherein the light-absorbing material comprises black resin, ink, or opaque resin.

15. The display panel according to claim 1, wherein the first projection at least partially surrounds the second projection.

16. The display panel according to claim 1, wherein the at least one light-emitting unit comprises a first-color light-emitting unit and a second-color light-emitting unit; and the first-color light-emitting unit comprises a first-color light-emitting layer, and the second-color light-emitting unit comprises a second-color light-emitting layer;

the opening portion comprises a first opening portion and a second opening portion, at least a part of the first-color light-emitting layer is located in the first opening portion, and at least a part of the second-color light-emitting layer is located in the second opening portion;

the light-shielding layer comprises a first light-shielding layer corresponding to the first opening portion, and a second light-shielding layer corresponding to the second opening portion, wherein an orthographic projection of the first light-shielding layer on the plane of the substrate is a first sub-projection; and an orthographic projection of the second light-shielding layer on the plane of the substrate is a second sub-projection; and a sum of a length of the first sub-projection in the first direction and a length of the second projection in the first direction is $W_{41}$, a length of the second opening of the first opening portion in the first direction is $W_{311}$, a sum of a length of the second sub-projection in the first direction and the length of the second projection in the first direction is $W_{42}$, and a length of the second opening of the second opening portion in the first direction is $W_{312}$, wherein $W_{41}-W_{311} \neq W_{42}-W_{312}$.

17. The display panel according to claim 1, wherein the display panel has a first display region and a second display region, the at least one light-emitting unit comprises a plurality of light-emitting units, at least two light-emitting units of the plurality of light-emitting units are located in the first display region, and another at least two light-emitting units of the plurality of light-emitting units are located in the second display region;

wherein light transmittance of the first display region is greater than or equal to light transmittance of the second display region;

wherein the at least two light-emitting units located in the first display region comprise a first light-emitting unit comprising a first light-emitting layer, and the another at least two light-emitting units located in the second display region comprise a second light-emitting unit comprising a second light-emitting layer;

wherein the opening portion comprises a third opening portion and a fourth opening portion, at least a part of the first light-emitting layer is located in the third opening portion, and at least a part of the second light-emitting layer is located in the fourth opening portion;

wherein the light-shielding layer comprises a third light-shielding layer corresponding to the third opening portion, and a fourth light-shielding layer corresponding to the fourth opening portion, wherein an orthographic projection of the third light-shielding layer on the plane of the substrate is a third sub-projection, and an orthographic projection of the fourth light-shielding layer on the plane of the substrate is a fourth sub-projection; and wherein a sum of a length of the third sub-projection in the first direction and the length of the second projection in the first direction is $W_{43}$, a length of the second opening of the third opening portion in the first direction is $W_{313}$, a sum of a length of the fourth sub-projection in the first direction and the length of the second projection in the first direction is $W_{44}$, and a length of the second opening of the fourth opening portion in the first direction is $W_{314}$, wherein $W_{43}-W_{313} \neq W_{44}-W_{314}$.

18. The display panel according to claim 17, wherein the first light-emitting layer and the second light-emitting layer emit light of different colors.

19. A display apparatus, comprising:
a display panel,
wherein the display panel comprises:
  a substrate;
  at least one light-emitting unit, wherein one of the at least one light-emitting unit comprises a first electrode and a second electrode that are opposite to each other, and a functional layer located between the first electrode and the second electrode, wherein the first electrode is located at a side of the functional layer facing towards the substrate, and the functional layer comprises a light-emitting layer;
  a pixel defining layer located between the first electrode and the functional layer, wherein the pixel defining layer comprises an opening portion and a non-opening portion, at least a part of the light-emitting layer is located in the opening portion; in a direction perpendicular to a plane of the substrate, the first electrode is located in the opening portion; and the opening portion comprises a first opening close to the substrate and a second opening away from the substrate; and
  a light-shielding layer located at a side of the non-opening portion facing towards the substrate, wherein in the direction perpendicular to the plane of the substrate, the light-shielding layer at least partially overlaps with the second electrode, and does not overlap with the first opening;
  wherein an orthographic projection of the light-shielding layer on the plane of the substrate is a first projection; an orthographic projection of the first electrode on the plane of the substrate is a second projection; a difference between a length of the second opening in a first direction and a sum of a length of the first projection in the first direction and a length of the second projection in the first direction satisfies a preset threshold; and the first direction is parallel to the plane of the substrate, and a straight line connecting each position on an edge of the first opening with a geometrical center of the first opening is parallel to the first direction.

20. The display apparatus according to claim 19, further comprising:
  a light-collecting module located at a side of the substrate facing away from the at least one light-emitting unit.